United States Patent
Murphy et al.

(10) Patent No.: US 9,491,027 B2
(45) Date of Patent: Nov. 8, 2016

(54) MINIATURE MOBILE MARKER SYSTEM AND METHOD

(71) Applicant: ComSonics, Inc., Harrisonburg, VA (US)

(72) Inventors: John J. Murphy, Harrisonburg, VA (US); Dennis A. Zimmerman, Harrisonburg, VA (US); Richard L. Shimp, Harrisonburg, VA (US); Marc-Yvon Comeau, Harrisonburg, VA (US)

(73) Assignee: ComSonics, Inc., Harrisonburg, VA (US)

( * ) Notice: Subject to any disclaimer, the term of this patent is extended or adjusted under 35 U.S.C. 154(b) by 0 days.

(21) Appl. No.: 15/053,234

(22) Filed: Feb. 25, 2016

(65) Prior Publication Data

US 2016/0173316 A1   Jun. 16, 2016

Related U.S. Application Data

(60) Continuation-in-part of application No. 14/193,076, filed on Feb. 28, 2014, which is a division of application No. 13/080,715, filed on Apr. 6, 2011, now Pat. No. 8,749,248.

(51) Int. Cl.
*G01R 27/28* (2006.01)
*H04L 27/34* (2006.01)
(Continued)

(52) U.S. Cl.
CPC ......... *H04L 27/3405* (2013.01); *G01R 31/021* (2013.01); *H04B 3/46* (2013.01); *H04L 25/08* (2013.01); *H04L 27/367* (2013.01); *H04W 24/08* (2013.01); *H04L 43/50* (2013.01)

(58) Field of Classification Search
CPC . H04L 27/3405; H04L 25/08; H04L 27/367; H04L 43/50; G01R 31/021; H04W 24/08
See application file for complete search history.

(56) References Cited

U.S. PATENT DOCUMENTS 3,990,003 A   11/1976   Agee, Jr.
4,072,899 A    2/1978   Shimp
(Continued)

FOREIGN PATENT DOCUMENTS

JP   07-240264    9/1995
JP   2006-029801  2/2006
KR   10-1021676   3/2011

OTHER PUBLICATIONS

TS® 100 Cable Fault Finder; http://www.flukenetworks.com/datacom-cabling/installation-tools/TS-100-Cable-Fault-Finder; 4 pages.
(Continued)

*Primary Examiner* — Dac Ha
(74) *Attorney, Agent, or Firm* — Whitham, Curtis & Cook, P.C.

(57) ABSTRACT

A small, portable signal generator provides a unique marker signal modulated with a selectable number of degrees of freedom for insertion into a portion of a broadband communication system (BCS) such as a subscriber installation site that may or may not be connected to the remainder of the BCS. If payload signals are not present or brief interference with payload signals is tolerable, a high level marker signal may be injected with level control upon detection of an egress signal to detect very minor leakage sources and thus increase quality of the qualification of installation or repairs. If payload signals are present, marker signals are held to non-interfering levels and frequencies. Authentication of a signal received through an antenna is expedited and increased in confidence level by synchronization of the marker signal modulation pattern and the signal detector in a receiver.

13 Claims, 10 Drawing Sheets

(51) Int. Cl.
*H04L 25/08* (2006.01)
*H04L 27/36* (2006.01)
*G01R 31/02* (2006.01)
*H04B 3/46* (2015.01)
*H04W 24/08* (2009.01)
*H04L 12/26* (2006.01)

(56) References Cited

U.S. PATENT DOCUMENTS

| | | | |
|---|---|---|---|
| 4,237,486 | A | 12/1980 | Shimp |
| 5,294,937 | A | 3/1994 | Ostleen et al. |
| 5,371,760 | A | 12/1994 | Allen et al. |
| 5,608,428 | A | 3/1997 | Bush |
| 5,633,582 | A | 5/1997 | Orndorff et al. |
| 5,751,766 | A | 5/1998 | Kletsky et al. |
| 5,978,449 | A | 11/1999 | Needle |
| 5,982,165 | A | 11/1999 | Bowyer et al. |
| 5,990,687 | A | 11/1999 | Williams |
| 6,282,265 | B1 | 8/2001 | Lowell et al. |
| 6,334,219 | B1 | 12/2001 | Hill et al. |
| 6,600,515 | B2 | 7/2003 | Bower et al. |
| 6,643,518 | B1 | 11/2003 | Weckstroem |
| 6,785,292 | B1 | 8/2004 | Vogel |
| 6,833,859 | B1 | 12/2004 | Schneider et al. |
| 6,906,526 | B2 | 6/2005 | Hart, Jr. et al. |
| 7,050,487 | B2 | 5/2006 | Schenk |
| 7,573,943 | B2 | 8/2009 | Cioffi |
| 7,729,417 | B2 | 6/2010 | Van Den Brink et al. |
| 8,311,412 | B2 | 11/2012 | Rakib |
| 8,351,411 | B2 | 1/2013 | Kim et al. |
| 8,868,971 | B2 * | 10/2014 | Zimmerman ........... H04L 43/12 714/25 |
| 8,902,958 | B2 | 12/2014 | Ginis et al. |
| 9,316,677 | B2 * | 4/2016 | Grunthaner .......... G01R 31/021 |
| 2008/0224712 | A1 | 9/2008 | Peyton et al. |
| 2011/0043640 | A1 | 2/2011 | Zinevich |
| 2011/0267474 | A1 * | 11/2011 | Sala ....................... H04N 17/00 348/180 |

OTHER PUBLICATIONS

Shin et al.; "Application of Time-Frequency Domain Reflectometry for Detection and Localization of a Fault on a Coaxial Cable"; IEEE Transactions on Instrumentation and Measurement, vol. 54, No. 6, Dec. 2005, pp. 2493-2500.

Lelong et al.; "On Line Wire Diagnosis by Modified Spread Spectrum Time Domain Reflectometry"; PIERS Proceedings, Cambridge, USA, Jul. 2-6, 2008, pp. 182-186.

Song et al.; "Dynamic Spectrum Management for Next-Generation DSL Systems"; IEEE Communications Magazine, Oct. 2002, pp. 101-109.

Blohm; "On-Line Fast Fourier Transform and Structural Return Loss Analysis During Cable Extrusion"; SIKORA Industrieelektronik GmbH, Bremen, Germany, 7 pages.

3M™ Dynatel™ Locating and Marking System, 2010, pp. 1-16.

Shi et al.; "Detection and Localization of Cable Faults by Time and Frequency Domain Measurements"; 7th International Multi-Conference on Systems, Signals and Devices, Jun. 2010, pp. 1-6.

Atkinson et al.; "Evaluating a HEMP-Hardened Signal Entry TPD Enclosure"; Harry Diamond Laboratories, 1990, pp. 1-62.

Ab-Rahman et al.; "Analysis of Components Failure, Malfunction Effect and Prevention Technique in Customer Access Network FTTH-PON"; Journal of Applied Sciences, vol. 11, No. 2, 2011, pp. 201-211.

* cited by examiner

MINIATURE MOBILE MARKER SYSTEM AND METHOD

CROSS-REFERENCE TO RELATED APPLICATIONS

This application is a Continuation-in-Part and, as to common subject matter, claims benefit of priority of U.S. patent application Ser. No. 14/193,076, filed Feb. 28, 2014, which is a division of U.S. patent application Ser. No. 13/080,715 filed Apr. 6, 2011, now U.S. Pat. No. 8,749,248, priority of which is also claimed, both of which are hereby incorporated by reference in their entireties.

FIELD OF THE INVENTION

The present invention generally relates to installation and maintenance of cable telecommunication systems and, more particularly, to detection of cable shielding flaws and measurement of signal egress in portions of such systems in which the communicated signal is quadrature amplitude modulated (QAM).

BACKGROUND OF THE INVENTION

Cable telecommunications systems, often referred to as broadband communication systems (BCSs), have been known for a number of years and are currently gaining in popularity and coverage for the distribution of television programming, telephone service and networking of computers such as providing Internet access since they can carry many signals over a wide bandwidth with little, if any, interference or significant distortion, particularly as data transmission rates have increased to accommodate ultra high definition television, increased volume of digital communication and the like. By the same token, since these communications are intended to be confined within the cable system, the increased bandwidth required for such communications need not be allocated from the available bandwidth for other communications such as radio, navigation, GPS, emergency or navigation communications and the like which must be transmitted as electromagnetic waves through the environment. However, flaws in cable shielding in cable telecommunication systems can allow signal egress which can potentially interfere with broadcast communications and potentially cause hazards. Reciprocally, flaws in cable shielding can permit signal ingress into the cable from the environment and degrade or interfere with the signals being carried by the cable telecommunication system. Therefore, such flaws must be quickly discovered and remedied as they occur due to weather, mechanical damage, aging or the like.

Detection of cable shielding flaws in the distribution portion of a Broadband Communication System (BCS) is generally achieved through detection of the signal carried by the cable transmission system that has leaked into the environment, essentially by being broadcast from the shielding flaw. Detection of a signal that has leaked or egressed from a cable flaw is generally performed in two stages: first, by a receiver in a mobile vehicle driven in the general vicinity of installed cables that associates a received signal with a location of the mobile vehicle using a global positioning system (GPS) receiver which thus reports a general location of a shielding flaw and, second, by a hand-held instrument that can allow repair personnel to follow increasing signal strength to the exact location of the shielding flaw so that repairs and/or maintenance can be carried out.

A similar procedure but on a smaller scale may be carried out during installation or repair of equipment at a subscriber location to qualify the installation and equipment as being capable of providing high quality service to the subscriber. However, it is more common to disconnect the subscriber installation from the BCS and to detect any signal increasing into the subscriber installation from the environment. If such an ingress signal is detected, the process must be repeated at different locations in the subscriber installation in order to determine the location(s) of the shielding flaw(s). Further, although detection of ingress can also be helpful in detecting sources of noise that originate within the subscriber's premises and immediate environment so that remedial action may be taken in regard to the noise source, the detection of ingress signals is dependent on the level and frequencies of ambient electrical noise and broadcast or over-the-air signals at the subscriber location to determine the quality of shielding integrity in the subscriber location. Therefore, if the ambient electrical signal/noise levels are low at a subscriber location, significant egress may still occur even though no signal ingress is detected. Therefore, techniques for detecting signal egress as a measure of susceptibility or resistance to signal or noise ingress within a subscriber location is more rigorous and quantitative than direct measurement of ingress.

Of course, such signal egress detection must be carried out in an environment in which noise as well as broadcast signals will also be present in the same frequency bands. Accordingly, a problem with all such systems is to identify a received signal as one originating in the cable telecommunications system and numerous techniques have been developed to effectively verify or authenticate a detected signal as an egress signal. An additional issue that follows from this problem is that a signal which is unique to the cable telecommunication system and distinguishable from broadband noise (e.g. a marker signal) has the potential for interfering with the signal carried by the cable telecommunication system and/or necessarily consumes a finite amount of bandwidth if within the frequency band of the payload signals on the BCS and of more than minimal amplitude.

An exemplary system seeking to provide a solution to these related issues is disclosed in U.S. Pat. No. 4,072,899, issued Feb. 7, 1978, to Richard L. Shimp, which is hereby fully incorporated by reference. In the system disclosed therein, a variable frequency (e.g. "warbled") audio tone is transmitted over the BCS, general by being added as a marker signal to the signal carried by the telecommunication system. Such an audio signal can be easily detected by a narrow band portable receiver such that the audio tone can be perceived and followed by maintenance personnel while being easily filtered from or having little effect on the other upstream or downstream signals carried by the cable telecommunication system. This arrangement has proven highly successful even though cable shielding flaws may be frequency selective; allowing egress at some frequencies but not others.

However, at the present time, the need to carry ever greater amounts of information (e.g. for high definition television (HDTV) and the like) has resulted in the choice of complex modulation schemes such as quadrature amplitude modulation (QAM) to multiplex signals which are, themselves, more complex and have increased data content. In general, a plurality of QAM multiplexers (often referred to as QAM generators) are used, each carrying a small number of channels of information, and their outputs are combined by allocating contiguous spectral bands to respective QAM multiplexers. The output of a QAM multiplexer or a plurality thereof is often statistically indistinguishable from ambient noise in the environment in which detection must be performed.

Accordingly, currently known techniques of signal egress detection have required the allocation of significant bandwidth (e.g. the equivalent of a band corresponding to a QAM multiplexer or at least the bandwidth corresponding to a television program channel) in order to provide a sufficiently complex signal for detection and identification without causing interference with other information carried by the cable telecommunication system. Allocation of such bandwidth has also been essential to measurement of the strength of signal egress allowing repairs to be prioritized and to assure compliance with regulations governing the operation of cable telecommunication systems.

Such an allocation of bandwidth thus reduces the otherwise available bandwidth of the cable telecommunication system and is essentially a large fixed cost of operating the system. Even with the allocation of economically significant bandwidth to the shielding flaw detection function, detection is not robust due to the limitation of marker signal power transmitted through a BCS in order to avoid interference and, where two or more cable telecommunication systems may be present in the same geographic area, identification of the system having the shielding flaw can often not be performed unless the marker signal is particularly complex; requiring more than minimal bandwidth allocation.
Additionally, a cable shielding flaw may only permit leakage of a power level that is too low to be detected amid ambient noise but is, nevertheless, an imperfection in shielding integrity which may be a point from which the leakage signal may increase to significant levels over time and/or may become a point of susceptibility for allowing extraneous electromagnetic energy to penetrate the flaw and interfere with payload signaling.

SUMMARY OF THE INVENTION

It is therefore an object of the present invention to provide a portable instrument that can inject a marker signal into a portion of the BCS which may or may not be disconnected from the remainder of an operative BCS to provide a highly robust capability for signal egress while still avoiding interference with signals carried by the BCS.

In order to accomplish these and other objects of the invention, a test instrument or marker signal injection tool is provided for detecting a shielding flaw in a broadband communication system (BCS) comprising a carrier signal generator, a selectively controllable modulation signal generator that develops a signal which is variable in frequency and amplitude to avoid interference with a payload signal, if present, or to cause marker signal egress from otherwise undetectable shielding defects if no payload signal is present or of interest, a modulator for modulating a signal produced by the carrier signal generator with a signal produced by the selectively controllable modulation signal generator, whereby the modulator produces a dual sideband signal as a marker signal having a modulation pattern with at least two degrees of freedom, and a connection for injecting an output of the modulator into a limited portion of a BCS.

In accordance with another aspect of the invention, a receiver or detector is provided for detecting a marker signal comprising at least two unique signals wherein the at least two unique signals include a modulation pattern comprising an antenna for receiving an electromagnetic signal, a synchronizer for receiving information identifying the modulation pattern, a register for storing the modulation pattern information received over the communication link, and a modulation pattern detector for detecting a modulation pattern of a received signal which is modulated in accordance with a modulation pattern corresponding to the modulation pattern information in the register.

In accordance with a further aspect of the invention, an apparatus is provided for locating a shielding flaw in a portion of a broadband communication system comprising a marker signal generator and a receiver, the marker signal generator comprising a carrier signal generator, a selectively controllable modulation signal generator that develops a signal which is variable in frequency and amplitude in accordance with modulation pattern information, a modulator for modulating a signal produced by the carrier signal generator with a signal produced by the selectively controllable modulation signal generator, whereby the modulator produces a dual sideband signal as a marker signal having a modulation pattern with at least two degrees of freedom, a connection for injecting an output of the modulator into a limited portion of a BCS, and a communication link for communicating the modulation pattern information to a receiver, the receiver comprising an antenna for receiving an electromagnetic signal, a synchronizer for receiving modulation pattern information identifying the modulation pattern, a register for storing the modulation pattern information received over the communication link, and a modulation pattern detector for detecting a modulation pattern of a received signal which is modulated in accordance with a modulation pattern corresponding to the modulation pattern information in the register.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
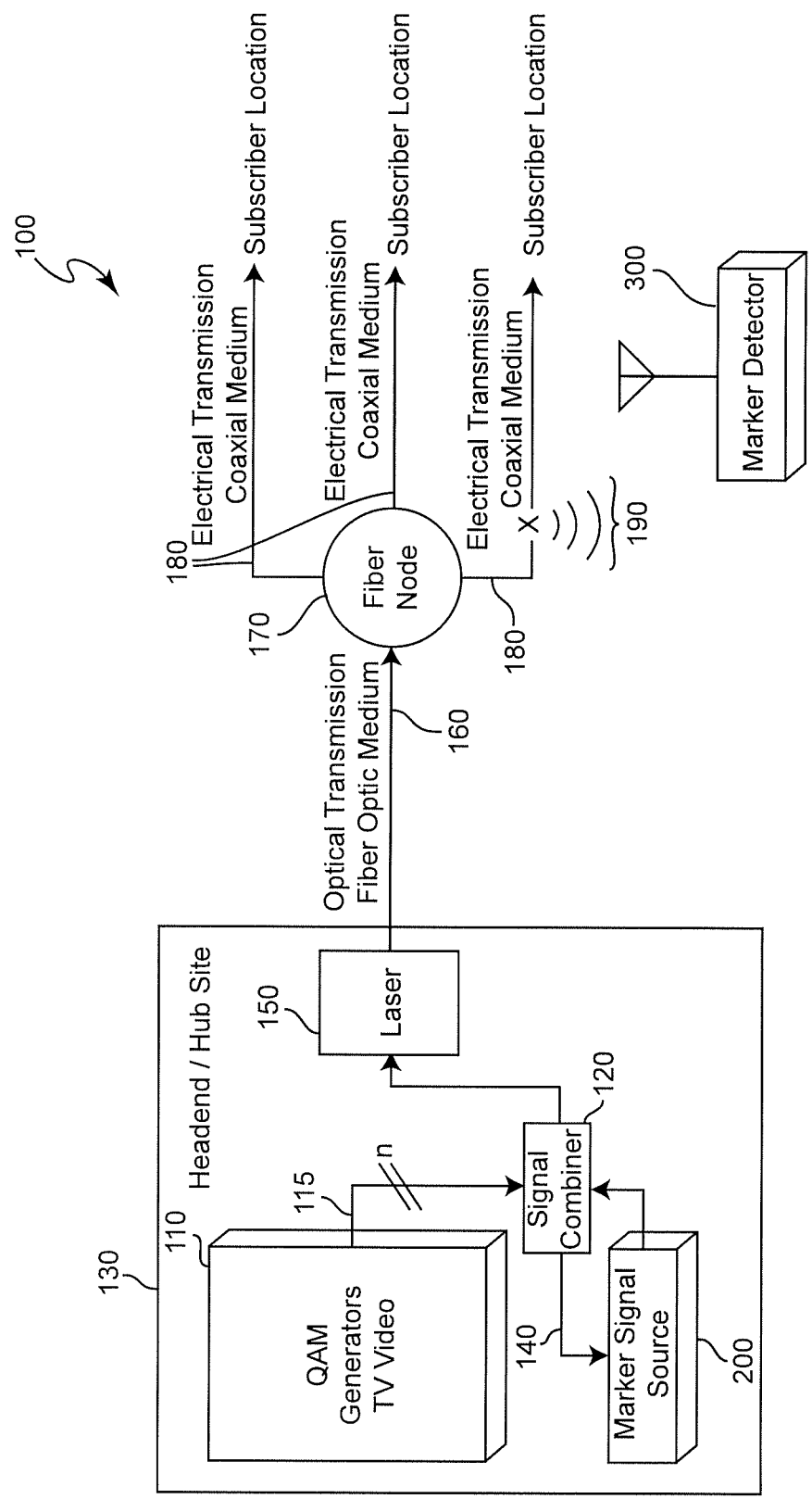
FIG. 1A is an overall high-level block diagram of the shielding flaw and detection system in accordance with the invention.

Referring now to the drawings, and more particularly to FIG. 1A, there is shown a high-level block diagram of the overall cable telecommunication system 100 in accordance with the present invention. It should be appreciated that the block diagram of FIG. 1A can also be understood as a flow chart depicting the methodology of the invention or a data flow diagram. It should also be appreciated that the depiction of the telecommunication system 100 shown in FIG. 1A reflects current technology in the constitution of the telecommunication system as well as integration of the invention into that environment and thus no portion of the drawings is admitted to be prior art in regard to the present invention. However, it should be understood that the invention can be practiced with legacy (e.g. analog) cable telecommunication systems as well as all-digital and other systems which may be developed or foreseen. The application to systems including some or all of the data input from QAM generators/multiplexers (so denominated since they generate a quadrature amplitude modulated signal and provide quadrature amplitude modulation for signals which are generally multiplexed, although no multiplexing of signals is preformed in the QAM generator/multiplexer itself) is simply a particularly challenging environment for shielding flaw detection and measurement in which the invention provides particularly meritorious effects and unexpected robustness of egress signal detection.

Figure 1B:
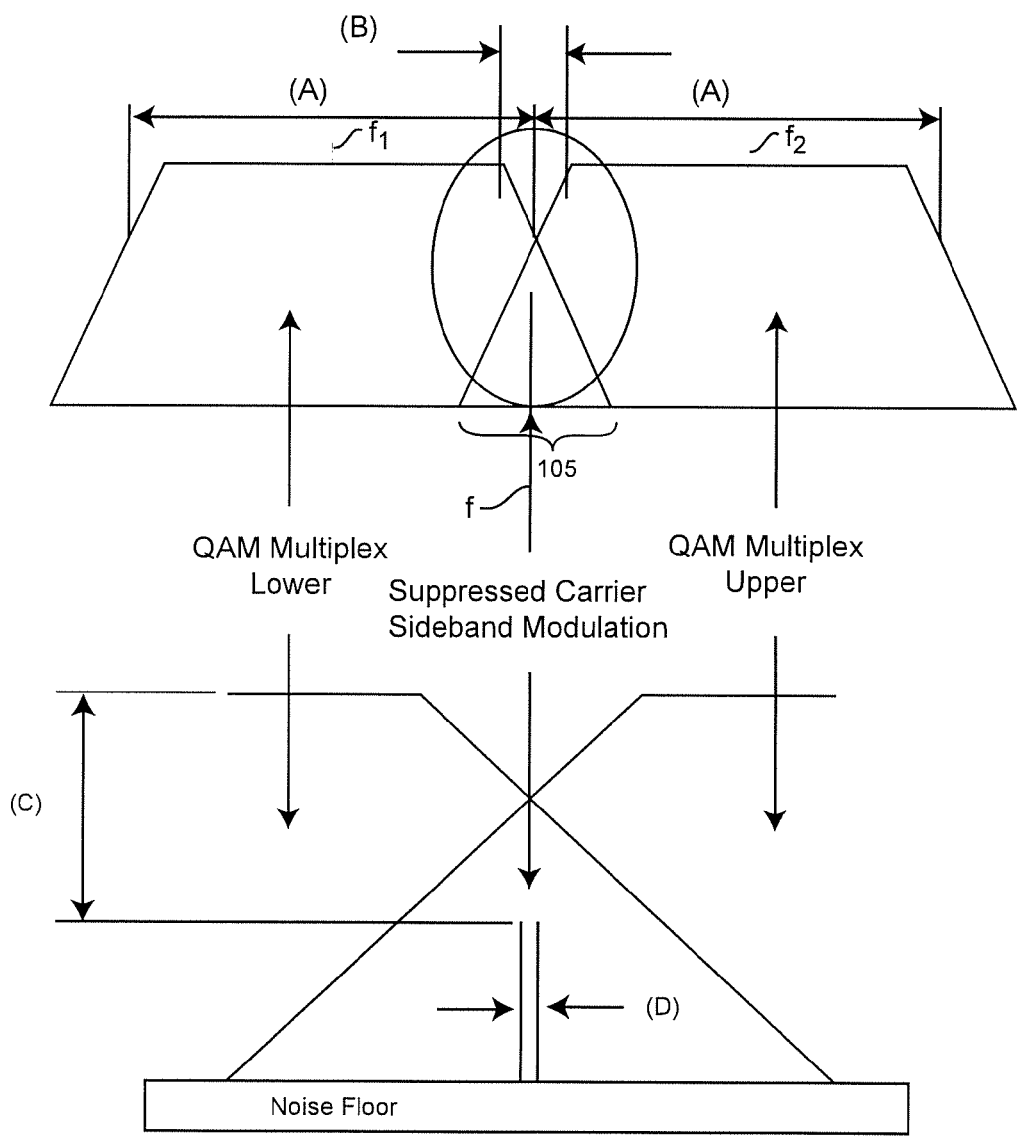
FIG. 1B is a diagram of a portion of the spectrum in which the invention is employed that is useful in understanding the operation of the invention.

The system 100, as illustrated in FIG. 1A comprises a plurality of sources 110 of input information. The types of information inputs are not particularly important to the practice of the invention in accordance with its basic principles but, at the current time, the plurality of sources may be constituted by a plurality of QAM multiplexers/generators, each receiving digital inputs from a plurality of sources. The number of sources that can be accommodated largely depends on the data rate of the input from each source which is often digital but analog signal sources can also be accommodated. The outputs of the QAM multiplexers are multi-level signals that are, essentially, a highly complex analog waveform having instantaneous amplitude levels representing discrete combinations of values; the full set of combinations of values being referred to as a constellation, that often statistically resembles noise. Thus, the QAM multiplexers may be regarded as not only multiplexed signal sources but digital to analog converters, as well. It should be appreciated, however, in regard to the operation of the invention, the QAM multiplexers need not provide any multiplexing function and should also be regarded as merely exemplary of data sources providing that data as a modulated signal (not limited to QAM) in a signal over a predetermined frequency band within the spectrum of the cable telecommunication system. The nominal spectra of two adjacent QAM bands are illustrated at A of FIG. 1B.

The signal combiner 120 may be any commercially available unit equipped with a test point, thus making available an output composite of the combined signaling for providing a feedback signal 140 to marker generator 200. The outputs of each of the QAM multiplexers are modulated to be allocated to a particular frequency band (e.g. nominally of 6 MHZ bandwidth in the United States but may be different in other countries) and are independently connected by plural connections 115 to signal combiner 120. These frequency bands will mostly be functionally contiguous (e.g. little information is contained in the "toes" of the bands where they may, in theory, overlap, as shown at 105 of FIG. 1B), except where certain other frequency bands falling within the overall signal spectrum that can be carried by the cable telecommunication system are allocated to particular purposes such as emergency warning communications. The output of the signal combiner 120 is then fed to a laser 150 which produces a broad band optical signal that is transmitted over fiber optic link 160 to fiber node 170 where the signal is converted to an electrical signal for distribution over shielded cables 180 to subscribers. It is shielding flaws 190 in cables 180 that the invention is directed to detecting using marker detector 300 illustrated in FIGS. 3 and 4C and discussed below.

In accordance with the invention, at the head end 130 of the cable telecommunication system 100, a marker signal source 200 is provided which is controllable in regard to the nature of the marker signal that is to be generated and which also receives feedback 140 from signal combiner 120 to control the amplitude of the marker signal so that avoidance of any perceptible interference with other signals can be guaranteed, as will be described in greater detail below. The output of the marker signal generator is also supplied as an input to combiner 120 which thus outputs a combined signal comprising the data in all of the frequency bands allocated to the data sources 110 such as the exemplary QAM multiplexers discussed above.

Figure 2:
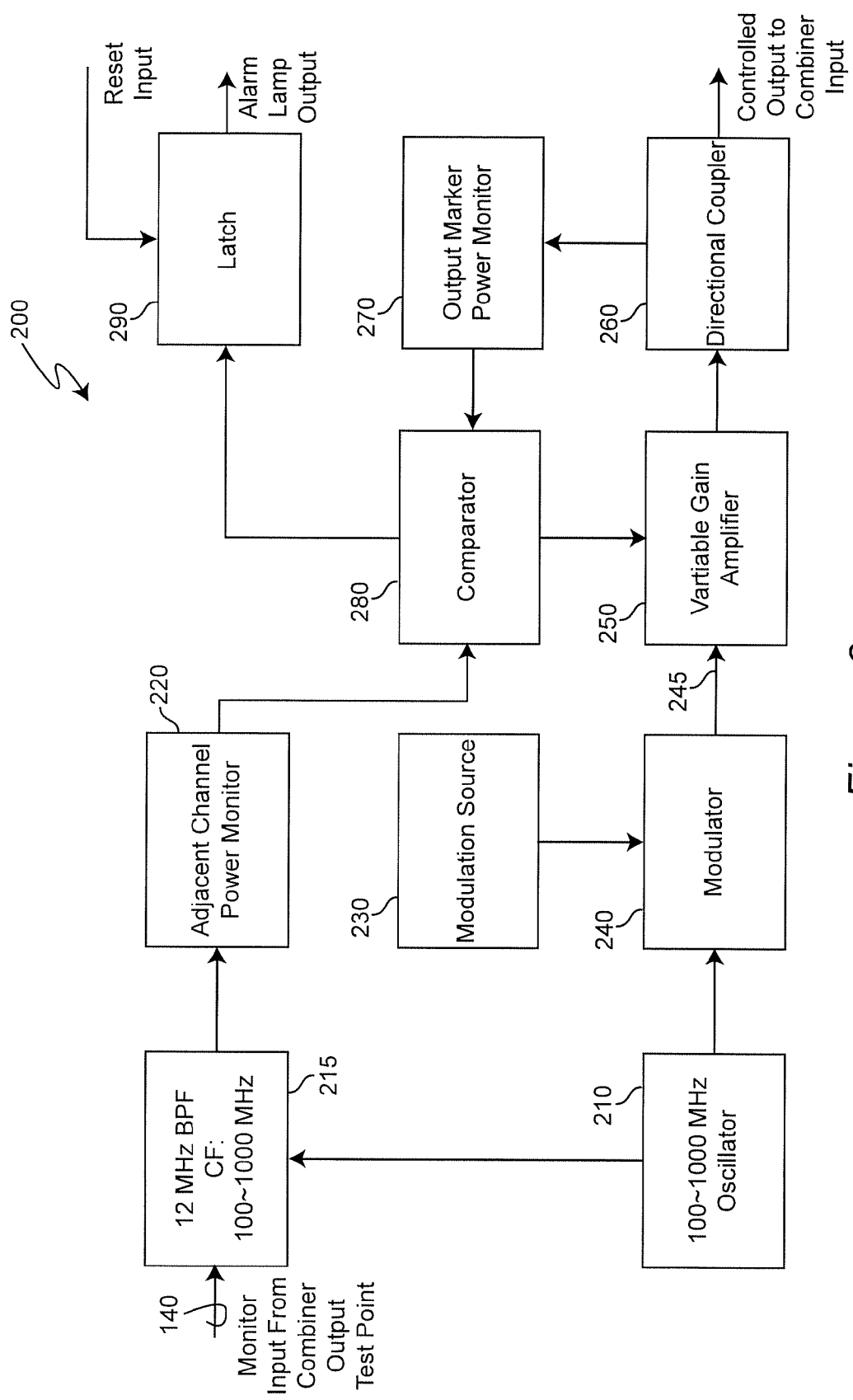
FIG. 2 is a high-level block diagram of the marker signal source in accordance with the invention.

Referring now to FIG. 2, the architecture of the marker generator will be discussed in detail. A tunable oscillator 210 provides a carrier signal for the marker (e.g. a marker carrier signal) and is set, in accordance with the invention, to a frequency, f (FIG. 1B), which is at the common boundary of or midway between two consecutively located and contiguous frequency bands, A, corresponding to two respective QAM multiplexed signals. The oscillator output signal or the frequency control information therefor is connected to a QAM band-width band pass filter (e.g. 12 MHZ in the United States, as noted above) 215 such that the center of the pass band of the filter is the same frequency as the frequency to which oscillator 210 has been set and at which frequency it is operating. It should be noted that it is not necessary to use a single QAM bandwidth filter as the same effect can be realized with two half-QAM bandwidth (e.g. 6 MHZ) filter devices, each tuned to a center frequency ($f_1$, $f_2$ in FIG. 1B) of the oscillator 210 frequency, plus or minus one-half of the specified QAM bandwidth allocation. Thus, the single or combined band pass filter will pass the signal of two consecutively positioned frequency bands corresponding to two QAM multiplexers in the output of combiner 120 which is fed back to the filter, as illustrated at 140 in both FIGS. 1A and 2. The frequency bands chosen are generally not important to the practice of the invention in accordance with its basic principles. The output of band pass filter 215 is then fed to a power monitor 220 to evaluate the power of each of the two adjacent/consecutively located frequency bands of two respective QAM multiplexers. The power of the frequency band containing the lower power is then communicated to comparator 280 as will be discussed in greater detail below.

The output of oscillator 210 is also input to a modulator 240 which also receives a modulation signal from a modulation source 230. The output of modulation source 230 need be nothing more than a sine wave of known frequency but may advantageously be made more complex by varying the frequency, adding digital coding (e.g. to contain a data payload or the like, singly or in combination). In some cases, an increased degree of complexity of the modulation signal may assist in unambiguous detection and identification of the marker amid significantly higher power levels of QAM signals which, as alluded to above, statistically resemble broadband noise. Additional coding can provide part or all of such additional complexity and provide a conduit for other information to detector 300 for calibration, scaling or any and all other purposes which may be deemed desirable for control or operation of the invention, some of which will be discussed in greater detail below while others will become apparent to those skilled in the art through experience in using the invention.

The output 245 of modulator 240 is preferably a double sideband, suppressed carrier signal. That is, the modulation performed by modulator 240 produces two side band frequencies separated from the carrier frequency of oscillator 210 by the frequency of the modulation signal from modulation source 230 indicated at D of FIG. 1B. The carrier frequency is of no further use and should preferably be suppressed to avoid being a potential source of interference. Thus, the remaining sidebands which will constitute the marker signal are placed within the consecutively located frequency bands, A, allocated to the two QAM multiplexers as discussed above where they could be a source of interference unless maintained at relatively low power; the reduced power level being indicated at C of FIG. 1B. It should also be appreciated that, by virtue of the above arrangement, the sidebands also are preferably placed in the fringes (indicated at B of FIG. 1B) of the frequency bands of the two consecutively located frequency bands allocated to the two QAM multiplexers where they are less likely to cause perceptible interference and may generally be somewhat more readily detectable. Sideband separation, D, and other unique signal traits resulting from the modulation source 230 acting on the modulator 240 provides the ability to unambiguously identify the emitted signal. This ability to unambiguously identify the marker signal is particularly important and useful to distinguish one cable telecommunication system from another where two or more such systems may have portions thereof installed within the same geographical area.

The output power of the marker signal is controlled by variable gain amplifier 250, the output of which is provided to a directional coupler 260, the through or low loss output of which forms the output of the marker signal source 200. The directional or high loss output is fed to a power monitor 270, an output of which also supplies an input to comparator 280 to be compared to the power of the less powerful of two consecutively located frequency bands allocated to two QAM multiplexers as discussed above. Responsive to these inputs, comparator 280 provides an output to control the gain applied to the marker signal 245 by variable gain amplifier 250 to keep the power of the marker signal lower than the lower powered of the two adjacent QAM multiplexer outputs by an amount which has been, for example, empirically determined to avoid any perceptible interference with the QAM signal (−30 dB is generally sufficient with current signaling practices and technology).

While not important to the practice of the invention in accordance with its basic principles, it is preferred to also provide logic or circuitry in comparator 280 to detect when control of marker signal power may be lost or cannot be kept at a non-interfering power level or possibly when marker signal power is of a level that would severely compromise the ability to detect a shielding flaw as might occur if the power of the signal from one of the pair of QAM multiplexers dropped to a very low level. This signal is provided to a latch 290 to control an alarm such as an indicator lamp, possibly in combination with a concurrent suspension of generation or injection of marker signals into the combiner 120, until reset upon correction of the condition that caused the loss of marker power control or potential interference. As a practical matter for the operator of a cable telecommunication system, it is very important to avoid interference with the signal distributed to subscribers both as a matter of customer satisfaction with the quality of delivered signals but also to avoid generation of service work orders in response to service complaints or incorrect prioritizing of maintenance work orders based on excessively high marker signal power causing shielding flaw severity to be erroneously indicated. It is precisely this strong and multi-faceted requirement for scrupulous avoidance of interference which has required the dedication of valuable bandwidth to shielding flaw detection in (otherwise) QAM environments in previously known systems; the avoidance of a requirement for which is a major meritorious effect of the present invention including provision of a variable power marker signal that can be kept at a non-interfering power level. By the same token, the invention assures that the maximum marker signal power level that does not cause perceptible interference is provided to optimize and optimally facilitate the detection of shielding flaws with relatively simple and small mobile/portable instruments.

Figure 3:
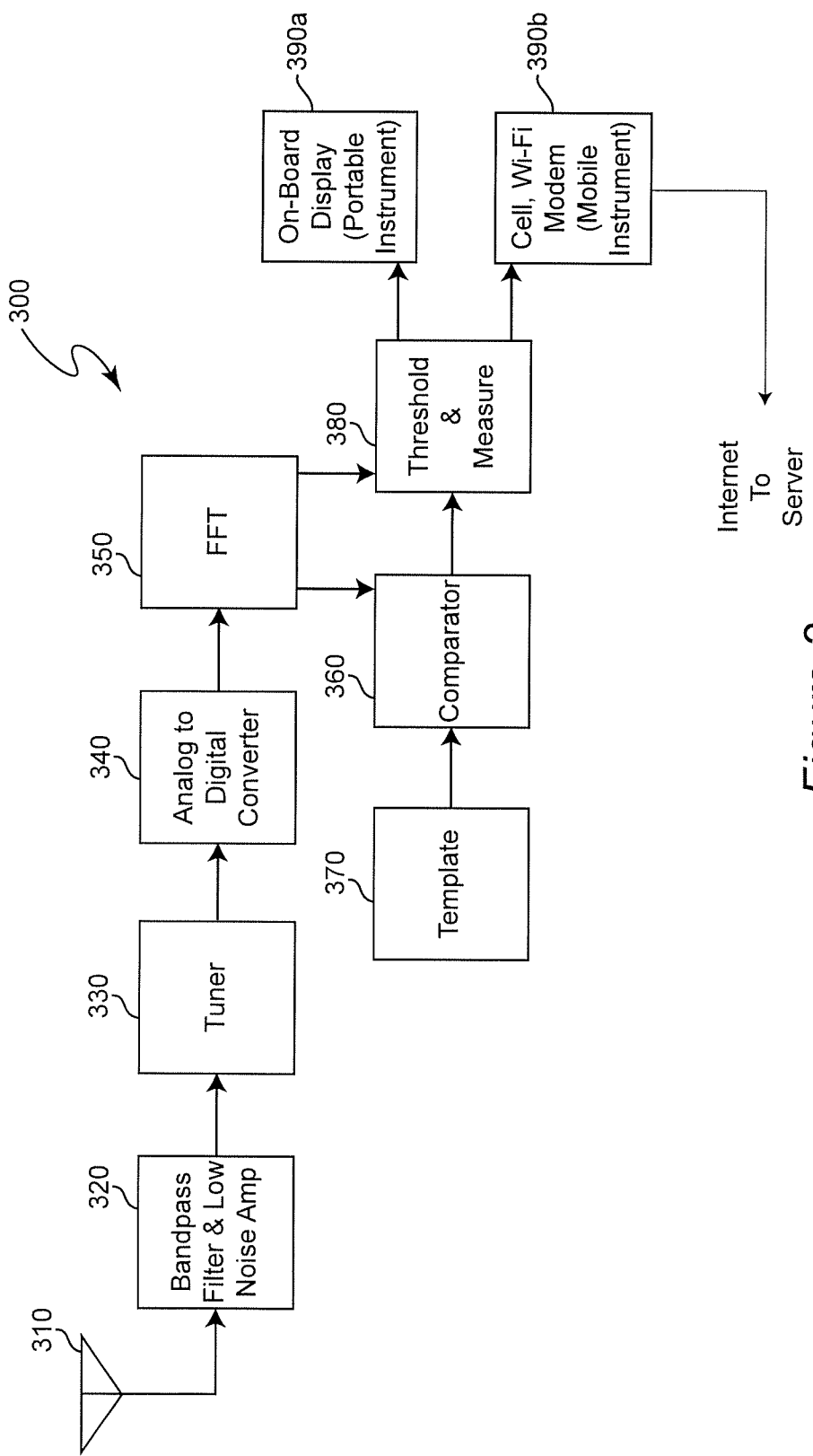
FIG. 3 is a high-level block diagram of the marker signal receiver in accordance with the invention.

Referring now to FIG. 3, a receiver/detector in accordance with the present invention will now be discussed. As alluded to above, two different types of instruments are preferably used in different phases of shielding flaw detection: a receiver in a mobile vehicle that can detect and report a possible egress signal from a shielding flaw (and an indication of its location and relative severity) and a portable instrument to further localize and locate the shielding flaw for conducting a repair and confirming efficacy of the repair made. Both types of instruments have the same architecture as depicted in FIG. 3 but will differ in the ultimate output structure 390a and/or 390b. By the same token, a single instrument could be made to serve both functions but such an embodiment is not preferred since a larger number of mobile instruments will ensure that far more of the area of cable telecommunication system 100 is examined for shielding flaws when a large population of service vehicles are provided with the mobile instrument and the communications facilities of the mobile instrument are of significant size and weight and would encumber optimal use of the portable instrument and are unnecessary in locating (as distinct from detecting the existence of) shielding flaws. In particular, the embodiment of the invention that will be discussed below in connection with FIGS. 4A-4C, if configured as a single instrument, would substantially encumber the contemplated method of use for locating leaks within a subscriber installation rather than over the entire BCS plant.

Background noise, including broadcast signals possibly including an egress signal from a cable telecommunication system, are received at antenna 31 and are band pass filtered and amplified using low noise amplifier 320. The resulting signal is fed to a tuner 330 tuned to the center frequency of the marker source (e.g. the carrier frequency at which oscillator 110 is operating). Thus, all frequencies are removed except those within a small bandwidth surrounding the frequency of the carrier signal (which has preferably been suppressed as alluded to above). Therefore, the only frequencies which remain are the side band marker signals and the small amount of power in the fringes of the two consecutively located QAM payload signals from the BCS plant, if present. These remaining signals are converted from analog form to digital form at A/D converter 340 and the frequency spectrum is calculated at 350, using a fast Fourier transform (FFT) or other technique such as a spectrum analyzer to allow extraction of the sideband signals. The magnitude of the frequency spectrum is then supplied to a comparator 360 where they are compared with one or more spectrum templates corresponding to the spectrum (e.g.

frequency and separation, D) of (unique) modulation signal(s) that have been provided in response to modulation source 230, as discussed above. Such comparison with templates can also reveal any coding (e.g. sideband separation or amplitude) or other signal complexity applied to the marker signal. It should be noted that the matching of templates (e.g. by cross-correlation) provides for discrimination between different cable telecommunication systems which are in close proximity to each other. Increased complexity of the marker signal also may provide increased robustness and facility of marker signal and corresponding shielding flaw detection. Coding of the marker signal (which also provides increased marker signal complexity) might be used to remotely control any aspect of the operation of receiver 300 such as switching from one carrier signal frequency to another or switching between different marker signal modulation schemes or modes to assure synchronization of operation of the transmitter 200 and receiver 300 of the invention which can provide further increased levels of robustness in confirming and identifying egress signals. When the degree of favorable comparison between template 390 and frequency spectrum 350 exceeds a predetermined threshold, then a measurement of the power present in the frequency spectrum 350 unique to the sidebands of the marker is performed. The peak, over a short time, of the sideband-unique power measurement is determined and communicated to the operator, typically using method 390*a* or 390*b*. In the case of the mobile instrument using method/instrument 390*b*, the location of the peak is also recorded and communicated. The output of threshold and measurement logic 380 is either fed to a wireless communication arrangement 390*b* or a portable computer for later downloading at a central facility (for a mobile type of instrument) or to an on-board display (for a portable instrument) such that the user can follow increasing signal strength to the location of a shielding flaw. The information communicated to the operator may then be used to indicate the severity and location of the detected leak.

One important possible and preferred use of coding of the modulation is to provide an indication of transmitted marker signal power to the receiver for proper setting of a threshold for detection and scaling of egress signal power measurement by threshold and measurement logic 380 in view of the variable marker signal power level required to guarantee freedom from perceptible interference with the signal distributed by the cable telecommunication system.

It should be appreciated from the foregoing that a marker signal comprising two amplitude and frequency controlled signals placed between or in the fringes of consecutive QAM bands can provide a much enhanced capability for robust detection amid ambient noise and over-the-air broadcast signals and facilitate unambiguous authentication of a received signal as an egressed signal while minimizing if not completely avoiding interference with payload signals carried by the BCS. The robust detection and authentication of egressed signals includes and is largely characterized by the ability to receive and identify a received signal at a level far below the low and non-interfering level at which it is included in a signal transmitted over the BCS and ambient over-the-air broadcast signals and noise. This facility is largely due to the possibility of the two (or more) signals being correlated to some degree and in some way such as is the characteristic of sidebands produced by modulation of a carrier signal. Thus, such a signal can be exploited in other ways to provide enhanced capabilities of performance of other services involved in the installation, operation and maintenance of a BCS as will now be discussed.

Specifically, a signal having the characteristics discussed above can be generated in a small and relatively simple portable instrument that can be used as a tool for locally injecting a marker signal into any portion of a BCS in order to detect shielding flaws or, preferably, such a signal generator can be arranged in association with a specialized and possibly similarly controlled receiver to detect an egressed signal with even greater sensitivity to hold signal egress to vanishingly low levels and greatly enhance the quality of qualification of an installation or repair, particularly at a subscriber site.

Figure 4A:
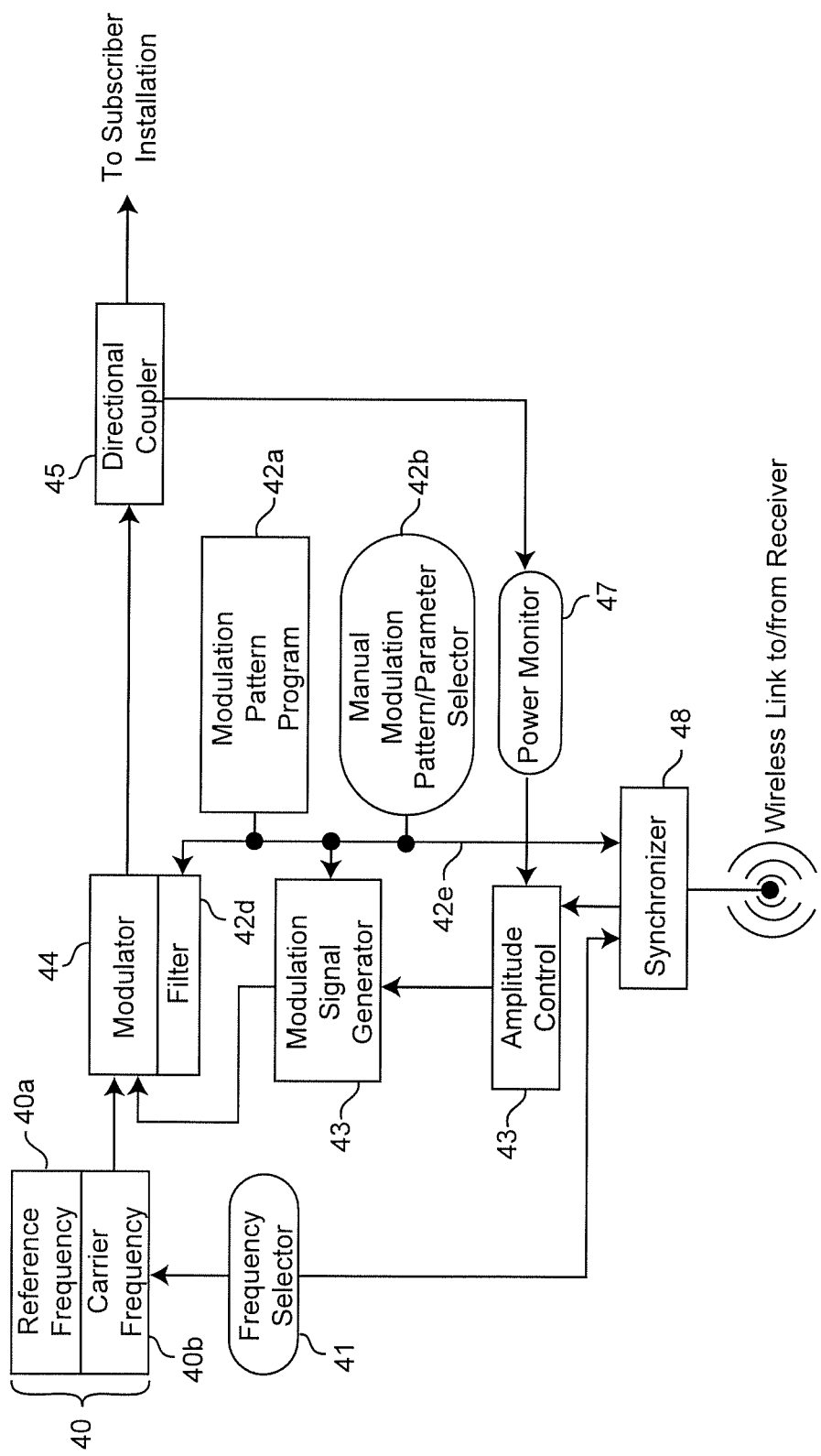
FIG. 4A is a high-level block diagram of a portable test marker signal instrument in accordance with the invention and configured for use where BCS signals are present.
Figure 4B:
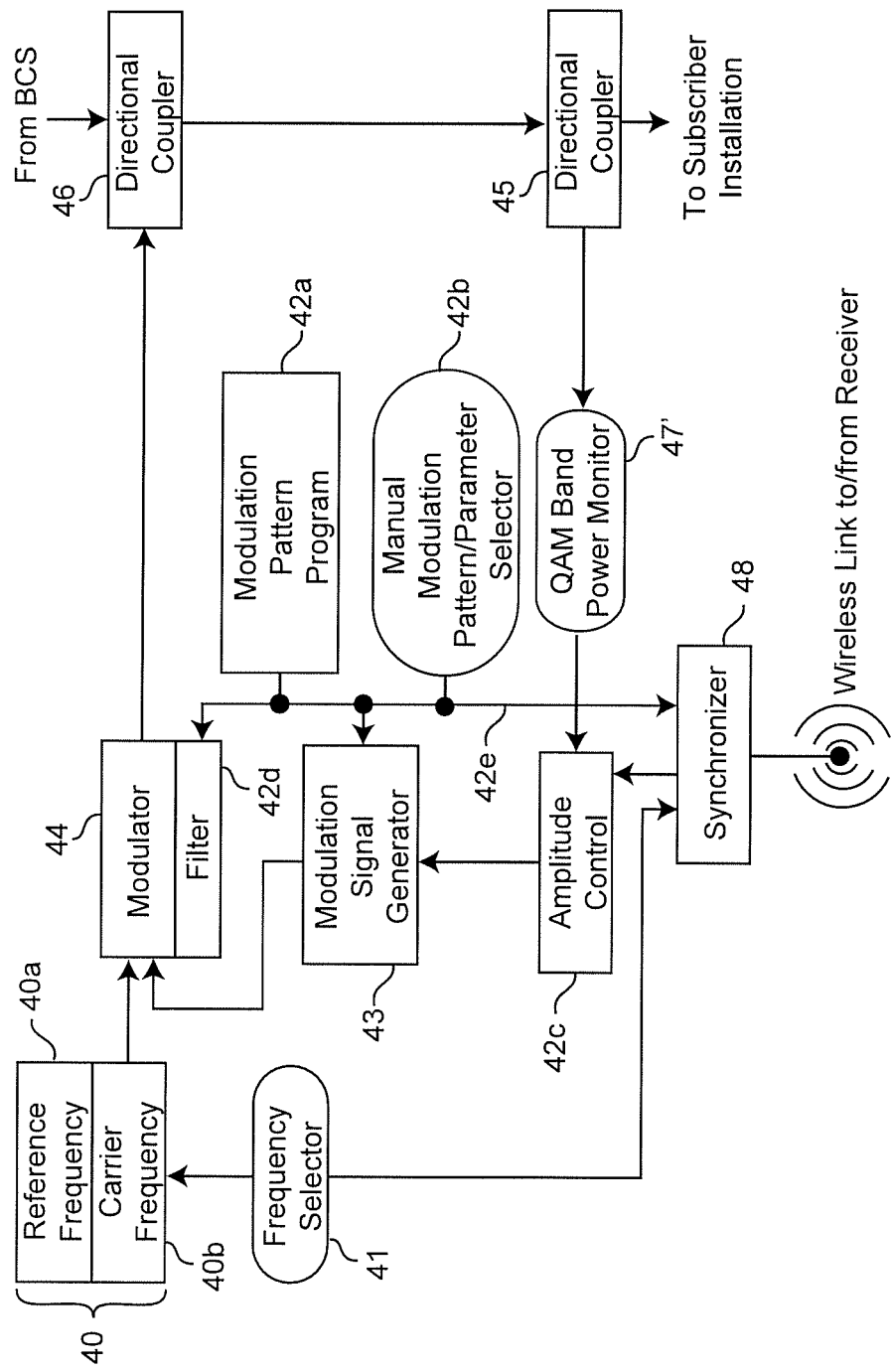
FIG. 4B is a high-level block diagram of a portable test marker signal instrument in accordance with the invention and configured for use where BCS signals are not present.

Referring briefly to FIGS. 4A and 4B, a high-level block diagram of a preferred form of a test instrument configured for use where BCS payload signals are or are not present, respectively, will now be broadly discussed. Particular details and arrangements to provide desirable facilities and attributes of the test instrument will be discussed in connection with discussion of the capabilities of the instrument to accommodate its anticipated use by field installation and repair personnel.

As alluded to above, while the preferred form of the test instrument is a self-contained transmitter and specialized, physically separate, self-contained receiver, especially since only a marker signal having properties as discussed above need be produced by the transmitter and the marker signal is the only signal of interest to be detected by the receiver. By the same token, certain economies of hardware, simplification of control and enhancements of sensitivity and received signal authentication can be provided in a much simplified form and much improved performance compared with transmission and detection of marker signals through the BCS can be provided. Of course, the transmitter and receiver could be physically combined or made easily connectable for some few tests, but such a configuration is not preferred and would cause a degree of inconvenience or even be inapplicable to the majority of the test protocol usually performed, such as following increasing marker signal power level to a shielding flaw where the transmitter may be required to be connected at a single location relative to a portion of the BCS system under test while the receiver is passed along the various cable paths of that portion of the BCS. In the following discussion, it should be appreciated that substantial simplification and improved performance of egress signal detection and authentication can be achieved through synchronization of the transmitter and receiver over a wired or, preferably, wireless link such as a wireless so-called Bluetooth or other short range wireless communication link which is generally not practical for egress signal detection over larger portions or the entirety of a BCS plant, possibly while adding signal modulation complexity that enhances authentication of a received signal as an egress signal.

Figure 5:
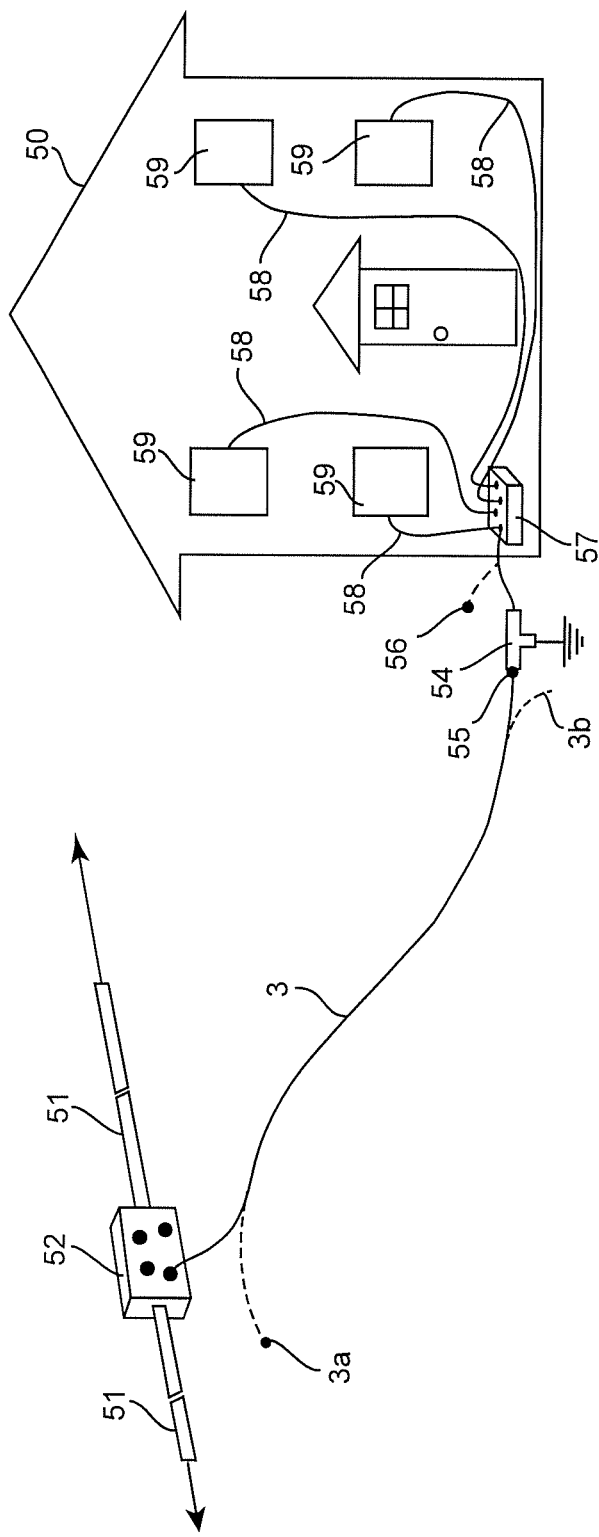
FIG. 5 is a schematic illustration of a subscriber installation.
Figure 6:
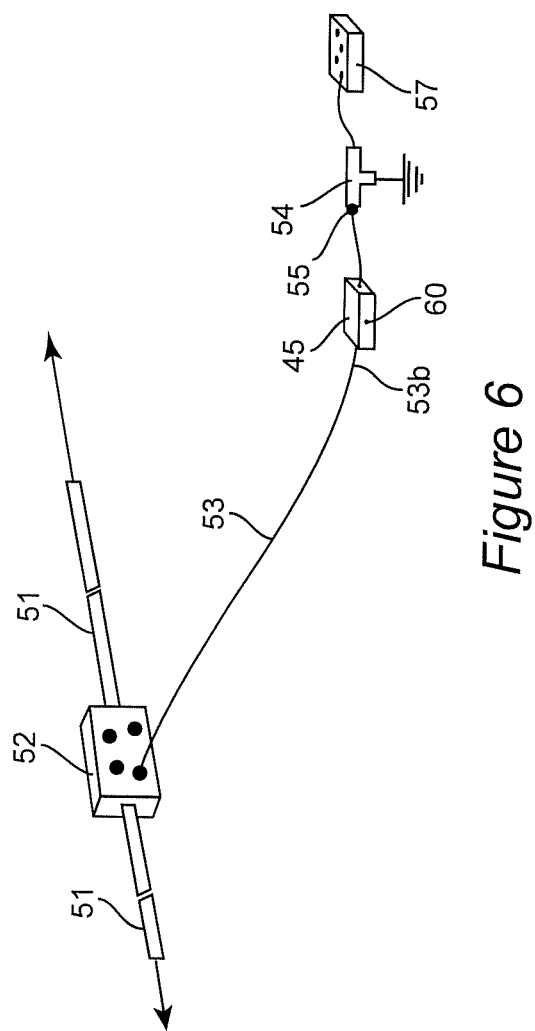
FIG. 6 is an enlarged portion of FIG. 5 illustrating use of the invention.

As alluded to above, the tool or test instrument in accordance with the invention is intended to be principally used in connection with a subscriber installation 50 as depicted schematically in FIG. 5 or 6. A portion of the distribution cable 51 of a BCS plant generally carries bi-directional signals to and from a head-end 130. At a location proximate to the subscriber location, a mainline distribution directional coupler 52, often referred to as a house tap, is provided in distribution cable 51 to provide for connection (or disconnection), 3*a*, of coaxial cable 3, often referred to as a house drop. Near the point at which the coaxial cable will enter the subscriber location, a grounded bonding block 54 is provided. The grounding block also provides a point (e.g. 55) at which the subscriber installation can be disconnected (3*b*, 56) from the BCS. A dwelling internal power splitter 57 is provided at and generally within the subscriber premises to provide for individual coaxial cable branch circuits 58 to individual customer premises equipment (CPE) such as modems, set top boxes (STBs) and the like as may be dictated by the subscriber's service requirements.

When a subscriber installation has been mechanically completed or when repairs of some type (including repair of shielding flaws that may have been discovered) have been completed, the above articulation of the subscriber installation provides for systematic testing for shielding flaws. In general, such testing for shielding flaws would begin with disconnecting the subscriber installation from the BCS at the house tap 52 and connecting the tool or test instrument transmitter at point 3a to inject a marker signal. If an egress signal is then detected, the house drop 3 can also be disconnected at location 3b and tested independently for any shielding flaw in the customary manner. If no shielding flaw is found in the house drop, the subscriber installation can be disconnected at the bonding block 54 and the marker signal injected at point 56. If signal egress is detected, each of the branches 58 and set top boxes (STBs) or other subscriber equipment, 59, and their connections can be disconnected from the internal power splitter 57 and marker signals injected into each branch, in turn, until the branch or branches having a shielding flaw or flaws are isolated and shielding flaws remedied. Other orders of testing are, of course, possible and possibly preferable. However, when no signal egress is detected the testing can be considered complete and terminated even though some or all of the branches and STBs 58, 59 may not have been individually tested. Therefore, the sequence described above is generally most efficient and will be recognized as very similar to the second stage of the detection procedure (e.g. with the marker signal injected at the head-end of the BCS) described above, but on a much reduced scale. It should also be appreciated that while the above procedure can be performed on a disconnected portion of the BCS such that no payload signals are present, can also be performed on a fully connected portion of the BCS where payload signals remain present. These two testing scenarios involve somewhat different connections as will be described below in connection with FIGS. 4A and 4B, respectively.

It should be appreciated in this regard, that when the subscriber installation or a portion thereof is disconnected from the BCS, a much higher level of marker signal can be employed since the subscriber installation is not carrying payload signals with which the marker signal could interfere. Since egress at a given frequency will depend on signal strength as well as on the severity of the shielding flaw, use of higher marker signal power will provide for detection of shielding flaws of much lesser severity and provide for a much higher quality level of qualification or repair of the subscriber installation. Additionally, such an effect is greatly augmented by the use of a unique marker signal that may be easily modulated with four or more degrees of freedom as will be discussed below to detect the marker signal at a much lower level amid noise and ambient electromagnetic signals; yielding an unexpectedly sensitive and robust detection and authentication of signal egress even without injecting signals of excessive power or for extended periods of time. It should also be noted in this regard that when a disconnection is made such as at 3a or 56, the connection point of the BCS will not ordinarily be properly terminated (or at least not conveniently so) and the connection point will essentially constitute a shielding flaw in the BCS and allow ingress of ambient signals such as egressing locally injected marker signals or allow egress of marker signals transmitted through the BCS plant. Therefore, it may be desirable to provide for limitation of power of locally injected marker signals based on the power level of detected egress signals as will be described in greater detail below even though the frequency control or placement between or in fringes of adjacent frequency or QAM bands will minimize any interference effect. On the other hand, since the invention essentially injects marker signals into a dimensionless signaling environment, the frequency of the marker signals need not be placed between or in fringes of QAM or other signal format bands and can be freely chosen or even swept over the entire BCS frequency band or portion thereof in order to detect shielding flaws that may be frequency selective. It is also important that locally injected marker signals be distinguishable from marker signals transmitted through the BCS; a facility also provided by the invention as will be described in greater detail below.

Referring now to FIG. 6, a portion of a subscriber installation similar to a portion of FIG. 5 is illustrated. Since there may be some circumstances where it may be desirable to use the invention without disconnecting the subscriber installation from the BCS, inclusion of a directional coupler 45 in the house drop cable is illustrated. Directional couplers are commercially available which allow any desired degree of difference in power coupled from the test signal insertion point 60 to the respective cables connected to the directional coupler to be provided. For example, a directional coupler may provide for the power of the injected marker signal delivered to the BCS to be 30 dB or more below the power of the injected marker signal delivered to the subscriber installation. If a directional coupler is used in this manner the marker signal power delivered upstream to the BCS should be limited based on payload signal power in adjacent QAM bands as discussed above. For the subscriber installation, the marker signal can be placed between adjacent channels or bands which are not currently being used by the subscriber so that interference is unimportant. If no such unused bands are available, the marker signal power delivered to the subscriber installation can also be limited to non-interfering levels as discussed above.

Figure 7A:
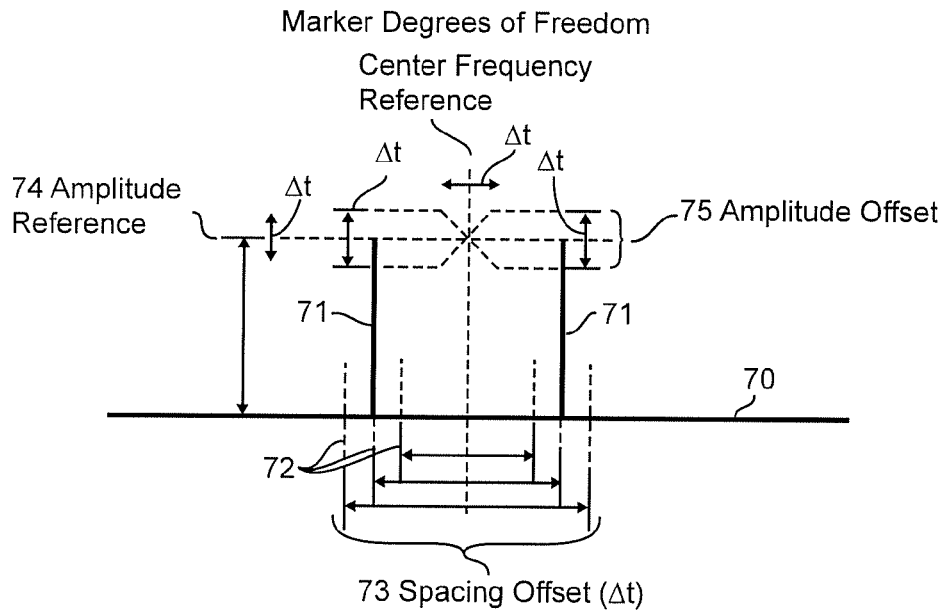
FIGS. 7A and 7B are diagrams illustrating provision and use of plural degrees of freedom in modulation control.
Figure 7B:
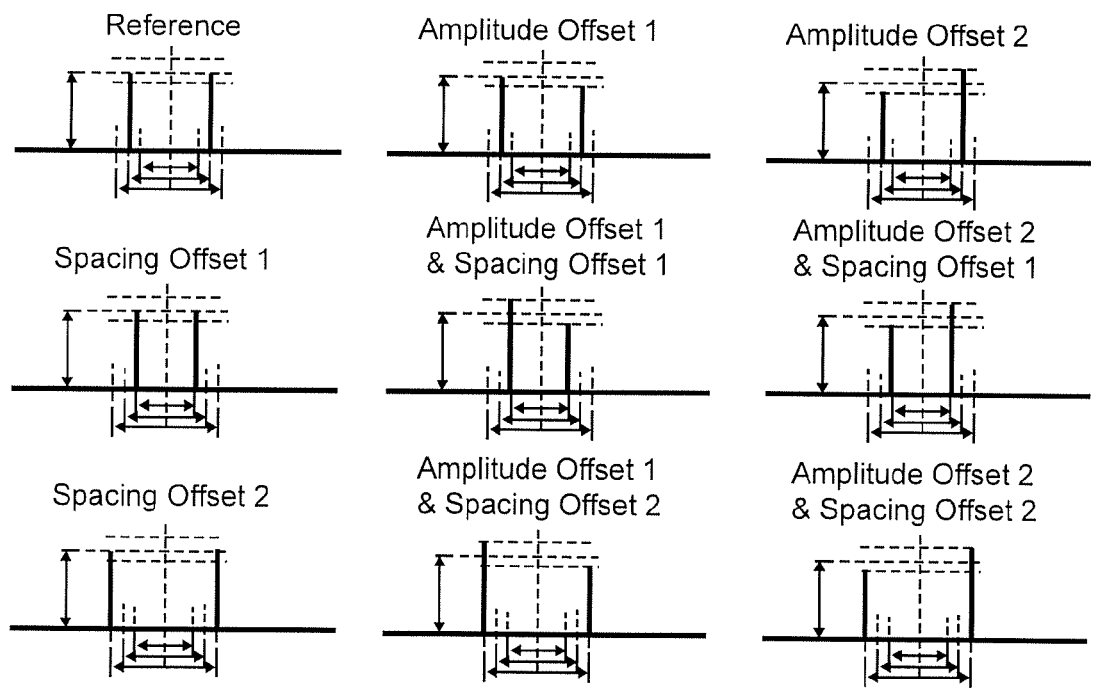

Referring now to FIGS. 7A and 7B, the degrees of freedom of a marker signal to be locally injected alluded to above will now be discussed. In FIG. 7A, line 70 represents a noise floor, either ambient or of the transmitter. As discussed above, the marker signal in accordance with the invention is preferably a double sideband, suppressed carrier signal, the sideband spectrum of which is represented by vertical lines 71. The frequency 72 of the sidebands is thus controlled principally by the frequency of the (suppressed) carrier signal and secondarily by the modulating frequency. The separation spacing 73 of the sidebands is controlled entirely by the modulating frequency. The absolute amplitude 74 is controlled by referenced leveling of modulation depth and the differential amplitude can be achieved by simple filtering; any or all of which may be varied at will in any combination to provide a signal which remains quite simple and easily generated and detected but which can also have a flexible complexity by varying of carrier frequency, modulation frequency, percentage modulation and filtering which can be altered and arbitrarily varied in a manner that is synchronized between transmitter and receiver in a manually controlled or programmed manner to achieve any desired control function or simply to add complexity to the marker signal to facilitate and expedite authentication of a received signal as an egress signal. That is, variations of frequency and amplitude of the marker signal generated and injected by the transmitter, some examples of which are illustrated in FIG. 7B, can be provided as a detection pattern or template to the receiver which achieves substantial additional sensitivity in a simple manner by detection that is limited to the specific frequency and amplitude variation in the injected signal. Such a pattern can be changed at will by coding of the amplitude and frequency variation by, for example, amplitude modulation and frequency-shift keying, particularly while tracking a detected egress signal.

Referring now to FIG. 4A, an embodiment of the transmitter portion of the invention as applied to a disconnected portion of a BCS system, as is generally preferred, is illustrated in a high-level block diagram form which can also be understood as a data flow diagram or a flow diagram of the operation of the invention. A signal source 40 which may be comprised of a reference frequency signal source 40a which may be useful for synchronization with or providing discrimination from another frequency (e.g. a GPS carrier frequency or QAM band center frequency) as may be desired for any purpose but not at all important to the basic principles of the invention such that a desired carrier frequency can be derived therefrom by frequency division or multiplication using a phase-locked loop or the like as illustrated at 40b. Alternatively, carrier frequency generator may be simply a free-running oscillator or the like controlled by a frequency selector or adjustment 41. The output of the carrier frequency generator is then provided to modulator 44, preferably including filter 42d. The output of the modulator 44 is the marker signal and is provided to a directional coupler 45 for connection to the subscriber installation or any desired portion on a BCS. A further terminal of the directional coupler (preferably the high-loss terminal) is also connected to power monitor 47. Even when this embodiment and environment of the transmitter is employed and high power levels of the marker signal are employed, it is desirable to quantify and regulate the marker signal power injected into the subscriber installation so that the quality of shielding integrity of the installation or repair can also be quantified to assure that any leakage will be a particular power level difference below any transmitted or injected signal in the subscriber installation.

Modulation of the marker signal is performed under control of signals from a plurality of sources 42a-42c and filter 42d provided over control bus 42e and from power monitor 47. It will be appreciated that these sources 42a-42c and filter 42d correspond, respectively, to four degrees of freedom in modulation of the marker signal as discussed above in connection with FIGS. 7A and 7B. Specifically, an automated modulation pattern program 42a is provided which provides a pattern of modulation parameters of amplitudes and frequencies to modulation signal generator 43 and pattern of amplitude differential 75 to filter 42d. Alternatively, or in combination therewith, similar modulation parameter information can be generated manually from modulation pattern/parameter selector 42b to provide additional degrees of freedom at the cost of only slight increase in modulation complexity such as in variance of frequency of amplitude and/or frequency variation. Of course, fewer degrees of freedom could also be utilized or the effective number of degrees of freedom multiplied by providing concurrent marker signals with different carrier frequencies that can be similarly or independently amplitude and/or frequency modulated.

Figure 4C:
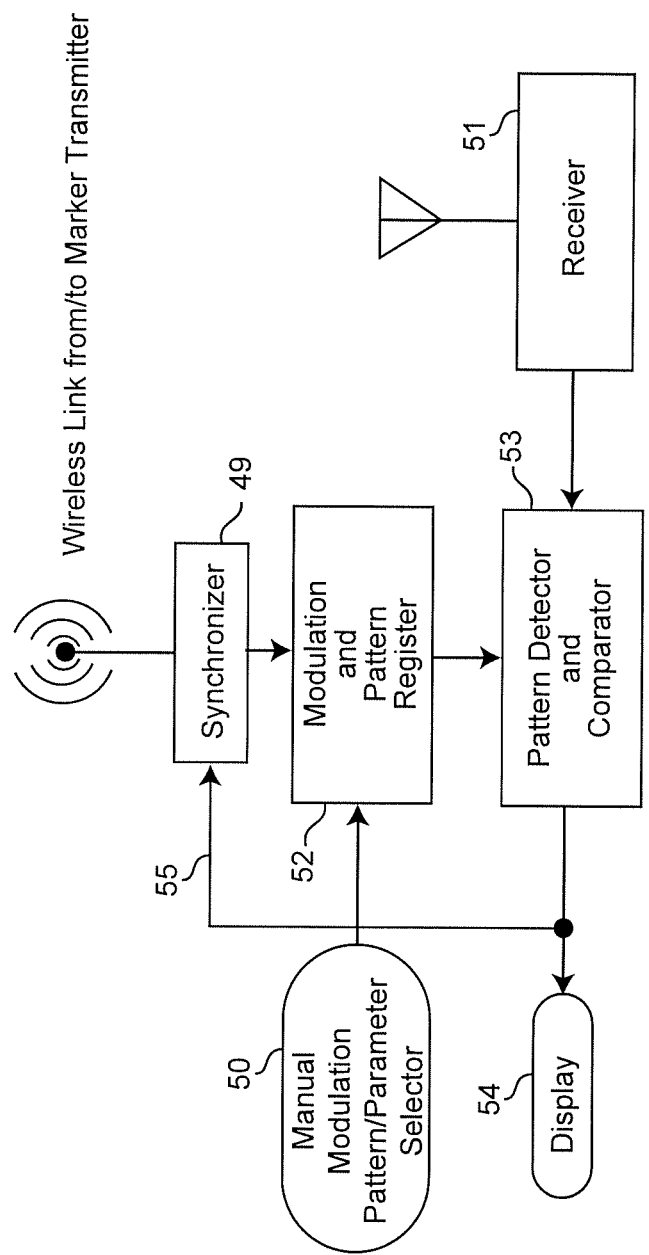
FIG. 4C is a high-level block diagram of a shielding flaw egress signal detector in accordance with the invention and adapted for use in connection with the marker signal generator instrument illustrated in FIGS. 4A and 4B.

This modulation pattern information is also provided to synchronizer 48 for communication to the receiver/detector of FIG. 4C, preferably through a bi-directional wireless link or by coding of the marker signal modulation. As will be discussed more fully below, this information and the carrier frequency information from frequency selector 41 controls the receiver/detector to be specific and highly selective to the modulation pattern of the injected marker signal in regard to any or all of the four degrees of freedom for modulation of the marker signal such that the marker signal may be made arbitrarily complex in a very simple manner while providing greatly increased robustness of marker signal detection and authentication as an egress signal in a short period of time. That is, in addition to detecting a modulated marker signal, an increased degree of certainty of authentication of a detected signal is provided by detecting changes in the modulation pattern as they occur and which can be controlled to change frequently or in response to detection and authentication of an egress signal. In much the same manner, a signal indicating detection of a marker signal can be returned to the transmitter from the receiver and further amplitude and/or frequency control performed in response thereto. Such control has a dual effect of allowing the marker signal to be injected at a potentially interfering level for brief periods of time which can enhance detection amid high levels of ambient noise and over-the-air broadcast signals while limiting any actual interference (or ingress into the connected or disconnected BCS) to a brief period that might not even be observable while providing an additional, independent confirmation of authentication of a detected signal as an egressing marker signal.

Referring now to FIG. 4B, an application of the transmitter of the invention preferred for testing where the BCS payload signals must be or are desirably present during the testing process will now be discussed. It will be readily appreciated that FIG. 4B is identical to FIG. 4A discussed above but for the use of two directional couplers and the use of a QAM band power monitor 47' which is similar to that discussed above in connection with FIG. 3 to additionally monitor the power level of adjacent QAM bands between which the marker signal in accordance with the invention is placed so that the amplitude of the marker signal can be kept at or adjusted to a non-interfering level below that of the lower power of the two adjacent QAM (or other modulation scheme) bands. Therefore, it is possible and preferable to design the transmitter in accordance with the invention to be switchable between the respective configurations of FIGS. 4A and 4B. It should also be appreciated that since the marker signals are injected into only a very small portion of the BCS, power requirements of the transmitter are very small and potentially very brief at relatively high marker signal power levels, adequate power can be provided for the transmitter by a small battery.

Referring now to FIG. 4C, a preferred form of the receiver/detector for use with the transmitter of FIGS. 4A and 4B will now be discussed. It will be apparent from even a cursory comparison with FIG. 3 that the receiver/detector can be much more simple and portable than the receiver/detector intended for more general use to detect marker signals transmitted through the BCS since it is only required to detect a particular selected modulation pattern.

Specifically, a relatively short range wireless link transceiver (or modulation decoder) and synchronizer 49 complementary to that of the transmitter are provided to communicate data representing the modulation pattern currently in use and desired control of injected marker signal power as discussed above are provided. Modulation pattern information received from the transmitter is stored in register 52 which can also receive similar information from manual modulation and pattern/parameter selector 50. Information representing the modulation pattern and parameters currently in use is then provided to pattern detector and comparator 53. Ambient signals in the vicinity of the BCS portion being tested are received through an antenna and receiver 51 which is tunable to the carrier frequency currently in use for generation of the marker signals. The function of the pattern detector and comparator 53 is very much simplified by the close synchronization with the transmitter modulation and pattern detector and comparator discrimination are closely coordinated therewith so that the propagation time variation between the transmitter and the detector is vanishingly small and need not be accounted for in template matching or cross-correlation or the like as discussed above. Further, the injected marker signal power is not significantly attenuated in the small portion of the BCS being tested and determination of the severity of any discovered leak is much more easily determined and possibly even categorized as to the nature of the shielding flaw from egress signal strength as a function of carrier signal frequency.

In view of the foregoing, it is clearly seen that the principles that support enhanced egress signal detection and authentication amid noise for BCS plant maintenance can also be applied locally to individual BCS portions and subscriber installations, in particular, from a small, easily portable battery-powered instrument while providing substantially enhanced sensitivity and robustness of detection of shielding flaws. Directional coupling or disconnection from the BCS when testing for shielding flaws allows the injected signal to be of relatively high amplitude locally, although the marker signal power can be limited, if necessary, depending on the circumstances of usage, and can thus detect extremely minor shielding flaws and deliver high quality qualification of a subscriber installation.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A test instrument or marker signal injection tool for detecting a shielding flaw in a broadband communication system (BCS), said test instrument or marker signal injection tool comprising
  a carrier signal generator,
  a selectively controllable modulation signal generator that develops a signal which is variable in frequency and amplitude to avoid interference with a payload signal, if present, or to cause marker signal egress from otherwise undetectable shielding defects if no payload signal is present or of interest,
  a modulator for modulating a signal produced by said carrier signal generator with a signal produced by said selectively controllable modulation signal generator, whereby said modulator produces a dual sideband signal as a marker signal having a modulation pattern with at least two degrees of freedom, and
  a connection for injecting an output of said modulator into a limited portion of a BCS.

2. The test instrument or marker signal injection tool as recited in claim 1, further comprising
  an arrangement for outputting information representing a modulation pattern currently in use.

3. The test instrument or marker signal injection tool as recited in claim 1, wherein
  said modulator produces a signal having a modulation pattern comprising four degrees of freedom.

4. The test instrument or marker signal injection tool as recited in claim 1, further comprising
  a second carrier signal generator,
  a second selectively controllable modulation signal generator that develops a signal which is variable in frequency and amplitude to avoid interference with a payload signal, if present, or to cause egress from otherwise undetectable shielding defects if no payload signal is present or of interest,
  a second modulator for modulating a signal produced by said second carrier signal generator with a signal produced by said second selectively controllable modulation signal generator, whereby said modulator produces a dual sideband signal having a modulation pattern with at least two degrees of freedom,
  whereby two carrier signals are modulated with different modulation patterns.

5. The test instrument or marker signal injection tool as recited in claim 1, wherein
  said connection is a directional coupler having a further output connection for said signal produced by said modulator.

6. The test instrument or marker signal injection tool as recited in claim 5, further comprising
  a power monitor connected to said further connection, and
  an amplitude controller for controlling amplitude of a signal produced by said modulation signal generator.

7. The test instrument or marker signal injection tool as recited in claim 1, wherein said connection comprises
  two directional couplers, one of said two directional couplers adding said signal from said modulator to payload signals present in a portion of a broadband communication system and another of said two directional couplers providing an output contain said signal from said modulator and said payload signals, and
  a payload signal power monitor to provide an output for controlling amplitude of a signal produced by said modulation signal generator in accordance with power of said payload signals.

8. The test instrument or marker signal injection tool as recited in claim 1, further comprising
  a communication link for transmitting a signal containing information identifying said modulation signal pattern of said marker signal.

9. The test instrument or marker signal injection tool as recited in claim 8, wherein
  said communication link is a wireless link.

10. The test instrument or marker signal injection tool as recited in claim 9, wherein said wireless link is a Bluetooth wireless link.

11. Apparatus for locating a shielding flaw in a portion of a broadband communication system, said apparatus comprising
  a marker signal generator and a receiver,
  said marker signal generator comprising
    a carrier signal generator,
    a selectively controllable modulation signal generator that develops a signal which is variable in frequency and amplitude in accordance with modulation pattern information,
    a modulator for modulating a signal produced by said carrier signal generator with a signal produced by said selectively controllable modulation signal generator, whereby said modulator produces a dual sideband signal as a marker signal having a modulation pattern with at least two degrees of freedom, and
    a connection for injecting an output of said modulator into a limited portion of a BCS, a communication link for communicating said modulation pattern information to a receiver, said receiver comprising an antenna for receiving an electromagnetic signal, a synchronizer for receiving modulation pattern information identifying said modulation pattern, a register for storing said modulation pattern information received over said communication link, and a modulation pattern detector for detecting a modulation pattern of a received signal which is modulated in accordance with a modulation pattern corresponding to said modulation pattern information in said register.

12. The apparatus as recited in claim 11 wherein said synchronizer transmits information indicating detection of a signal having a modulation pattern corresponding to said modulation pattern information.

13. The apparatus as recited in claim 12, wherein said modulation pattern information is altered in said transmitter in response to receiving said information indicating said detection of said signal having a modulation pattern corresponding to said modulation pattern information.

* * * * *